United States Patent [19]
Kojima et al.

[11] Patent Number: 6,114,708
[45] Date of Patent: Sep. 5, 2000

[54] ELECTRON-BEAM EXPOSURE APPARATUS AND EXPOSURE METHOD

[75] Inventors: Yoshikatsu Kojima; Ken-ichi Tokunaga, both of Tokyo, Japan

[73] Assignee: NEC Corporation, Tokyo, Japan

[21] Appl. No.: 08/972,040

[22] Filed: Nov. 17, 1997

[30] Foreign Application Priority Data

Nov. 19, 1996 [JP] Japan ................................. 8-308479

[51] Int. Cl.⁷ ................................................. H01J 37/302
[52] U.S. Cl. ................................. 250/492.23; 250/491.1
[58] Field of Search ........................ 250/492.23, 491.1

[56] References Cited

U.S. PATENT DOCUMENTS

| 4,413,187 | 11/1983 | Akazawa et al. | 250/492.23 |
| 5,468,969 | 11/1995 | Itoh et al. | 250/492.23 |
| 5,478,698 | 12/1995 | Rostoker et al. | 430/296 |
| 5,886,357 | 3/1999 | Kojima | 250/492.23 |

FOREIGN PATENT DOCUMENTS

| 10-10701 | 1/1998 | Japan | G03F 1/08 |
| 10-83945 | 3/1998 | Japan | H01L 21/027 |

OTHER PUBLICATIONS

Nakayama et al., "Electron–beam cell projection lithography: A new high–throughput electron–beam direct–writing technology using a specially tailored Si aperture", J. Vac. Sci. Technol., vol. B8, No. 6, 1836–1840 (1990).

*Primary Examiner*—Jack Berman
*Attorney, Agent, or Firm*—Foley & Lardner

[57] ABSTRACT

An electron-beam exposure apparatus, comprising an electron gun for emitting an electron beam, a first aperture for shaping the electron beam in a prescribed manner, and a second aperture, which is provided with an opening for varying the cross-sectional shape of the electron beam passing through the first aperture. The second aperture is provided with a variable-shape opening, partial one-shot exposure openings, beam spot dimension correction openings, and deflectors for deflecting the electron beam passing through the first aperture, said deflectors being disposed between the first and second apertures.

24 Claims, 9 Drawing Sheets

F I G. 2
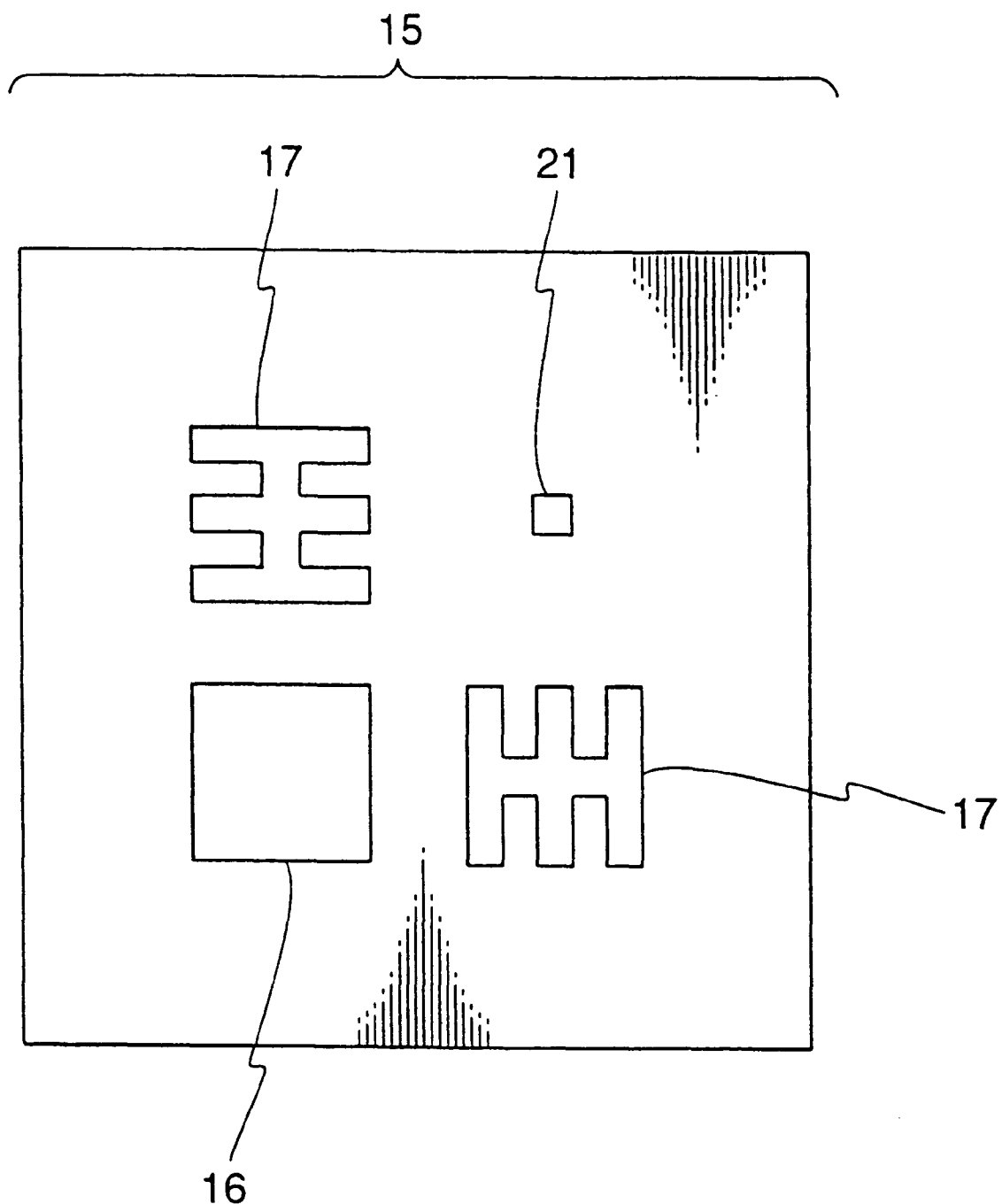

ELECTRON-BEAM EXPOSURE APPARATUS AND EXPOSURE METHOD

FIELD OF THE INVENTION

The present invention relates to an electron-beam exposure apparatus and exposure method, and more particularly to an electron-beam direct exposure technique for manufacturing LSI circuits by lithographic methods. Specifically, the present invention relates to an apparatus capable of correcting the dimensions of a beam spot when an exposure pattern is formed on a wafer surface by an electron-beam direct exposure technique based on partial one-shot exposure, and to a correction method therefor.

BACKGROUND OF THE INVENTION

The trend toward a finer line width has become more pronounced in recent years in the fields related to the design and manufacture of VLSI circuits. It is therefore becoming more difficult to form fine lines of required width by methods of reduction projection and exposure based on the use of conventional ultraviolet light.

Electron-beam direct exposure is a method that meets requirements for such finer exposure patterns. The electron-beam direct exposure method features electron-beam spots finely focused by reduction lenses. Pattern exposure is accomplished by a so-called tracing method. A resulting shortcoming is that the throughput and the manufacturing efficiency are lower than those achieved with methods involving reduction projection and exposure.

Electron-beam direct exposure equipment operating on a partial one-shot exposure principle has recently been developed in order to overcome this shortcoming.

FIG. 8 depicts the structure of an electron-beam direct exposure apparatus operating on the partial one-shot exposure principle. As shown in FIG. 8, the electron-beam direct exposure apparatus comprises an electron gun 11 for emitting an electron beam EB, and a first aperture 12 provided with a quadrilateral opening. The electron-beam direct exposure apparatus also comprises a second aperture 15 that allows the electron beam passing through the first aperture 12 to be transformed to a prescribed shape and size. The second aperture 15 is therefore provided with a quadrilateral variable-shape opening 16 as a conventional means of electron-beam direct exposure. At the same time, the second aperture 15 is provided with a plurality of partial one-shot exposure openings 17 whose shape corresponds to a portion of the pattern to be exposed.

When exposure is actually performed using a conventional electron-beam direct exposure method, the cross-section of the electron beam EB emitted by the electron gun 11 is initially changed to a quadrilateral shape by the first aperture 12. The electron beam EB that has acquired the quadrilateral shape is then directed by a variable-shape deflector 13 toward the area of the variable-shape opening 16 in the second aperture 15. At this time, the electron beam strikes the second aperture 15, and the portion of the electron beam that has passed through the variable-shape opening 16 is directed toward the wafer 20.

Consequently, adequately correcting the position in which the electron beam EB strikes the second aperture 15 allows the shape of the electron beam EB passing through the second aperture 15 to be changed to any beam spot size. The electron beam EB shaped by the variable-shape opening 16 is reduced by a reduction lens 18 and is ultimately directed by a deflector 19 toward any point on the wafer 20.

The partial one-shot exposure openings 17 formed in the second aperture 15 will now be described. During partial one-shot exposure, the electron beam EB formed by the first aperture 12 is directed by a selecting deflector 14 toward any of the partial one-shot exposure openings 17 in the second aperture 15. The electron beam EB that has been formed in accordance with the shape of the partial one-shot exposure openings 17 in the second aperture 15 is reduced by a reduction lens 18 and is directed by the deflector 19 toward any point on the wafer 20.

Exposure performed using such partial one-shot exposure openings 17 allows target patterns to be exposed by being irradiated with a single electron beam EB. Consequently, providing the second aperture 15 in advance with openings that correspond to various patterns makes it possible to reduce the number of exposure shots in comparison with cases in which patterns with complex shapes are exposed through a variable-shape opening 16. As a result, the throughput is markedly increased.

During actual partial one-shot exposure, the surface area of the second aperture 15 is limited. Therefore, it is difficult in practical terms to form partial one-shot exposure openings that would fit all types of patterns to be exposed. Consequently, partial one-shot exposure openings are formed in the second aperture only for the patterns that are repeated to a certain extent, with parts of the patterns removed in advance. Such repeating patterns are exposed by partial one-shot exposure, and any nonrepeating patterns in contact with these patterns are exposed using the variable-shape opening 16.

However, the following problems are encountered when the wafer 20 is exposed by electron-beam direct exposure in such a manner. Specifically, partial one-shot exposure is used on the repeating portions of various patterns, and the variable-shape opening 16 is used to perform exposure on nonrepeating portions, so patterns obtained by different exposure methods come into contact with each other. As a result, dimensional differences (line width or line length) exist between the patterns in the areas where patterns obtained by exposure through the variable-shape opening 16 are connected with patterns obtained by partial one-shot exposure. The reason is that dimensional differences exist between the beam spot formed on the wafer 20 by the variable-shape opening 16 and the beam spot produced by partial one-shot exposure. A resulting drawback is a reduction in the reliability of an LSI device manufactured by this method.

The reasons causing the aforementioned dimensional differences will now be described in detail. When performing exposure through the variable-shape opening 16, it is possible to carry out a prescribed correction prior to the actual exposure step. To accomplish this, a reference mark or the like used for correction purposes is first placed on the stage that carries the wafer 20. This reference mark is scanned with a beam spot of prescribed size. The dimensions of the actual beam spot can be determined based on the reflected electron signal generated. It is thus possible to constantly maintain accurate beam spot dimensions by correcting these dimensions when they vary due to fluctuations or the like in the ratio to which the electron beam has been reduced by a reduction lens.

By contrast, partial one-shot exposure involves preforming patterns as partial one-shot exposure openings 17 in the second aperture 15. Therefore, it is sometimes impossible to obtain accurate beam spot dimensions that accord with design values on the wafer 20 due to fluctuations or the like in the manufacturing precision attained during the formation of the openings 17 for partial one-shot exposure or in the ratio to which the electron beam EB is reduced by the reduction lens 18. In such cases it is difficult to accurately measure the beam spot dimensions of a plurality of patterns projected onto the wafer 20. As a result, it is impossible to correct the dimensions of a beam spot produced by a partial one-shot exposure opening, and line width errors or the like occur in connected portions in the manner described above.

When, for example, a pattern whose line width design dimension is 0.20 micrometer is exposed using a variable-shape opening 16 and a partial one-shot exposure opening 17 (as shown in FIG. 9), the size of the beam spot produced by the variable-shape opening 16 can be accurately obtained at a level of 0.20 micrometer by the above-described correction procedure. By contrast, the beam spot dimensions of the electron beam EB obtained using the partial one-shot exposure opening 17 are governed by the opening dimensions of the second aperture 15, the reduction ratio of the reduction lens, and the like, making it impossible to correct the beam spot dimensions.

FIG. 9 depicts a case in which the pattern dimensions provided by the partial one-shot exposure opening exceed the design values by 10%.

SUMMARY OF THE INVENTION

The present invention relates to an electron-beam exposure apparatus and exposure method, and more particularly to an electron-beam direct exposure technique for manufacturing LSI circuits by lithographic methods. Specifically, the present invention relates to an apparatus capable of correcting the dimensions of a beam spot when an exposure pattern is formed on a wafer surface by an electron-beam direct exposure technique based on partial one-shot exposure, and to a correction method therefor.

An object of the present invention is to provide an apparatus and method for reducing the differences in dimensions between the beam spots created in a reciprocal fashion by patterns produced using partial one-shot exposure and patterns produced using a variable-shape opening when these patterns are exposed by partial one-shot exposure in an electron-beam direct exposure apparatus.

The present invention, which pertains to an electron-beam exposure apparatus, comprises the following components. Specifically, it comprises a first aperture for shaping an electron beam in a prescribed manner, and a second aperture, which is provided with an opening for varying the cross-sectional shape of the electron beam passing through the first aperture. The second aperture is provided with a variable-shape opening, partial one-shot exposure openings, and beam spot dimension correction openings. In addition, deflectors for deflecting an electron beam passing through the first aperture is disposed between the first and second apertures.

Beam spot dimensions are corrected when exposure is actually performed. The correction method comprises the following steps. Specifically, it comprises a step for sensing the reference current of an electron beam in which the dimensions of a beam spot are accurately adjusted by a variable-shape opening in order to define the reference current; a step for projecting the electron beam onto a beam spot dimension adjustment opening; a step for sensing the current of the electron beam passing through the beam spot dimension adjustment opening; a step for calculating the error in the beam spot dimensions on the basis of the difference between the reference current and the actual current; and a step for controlling the deflector in such a way that the calculated error is corrected, and correcting the dimensions of the beam spot produced by the variable-shape opening.

This invention allows the dimensions of a beam spot obtained using a variable-shape opening to correspond to the dimensions of a beam spot obtained using a partial one-shot exposure opening.

BRIEF DESCRIPTION OF THE DRAWINGS

FIG. 2 is a plan view depicting the second aperture shown in FIG. 1;

DETAILED DESCRIPTION OF THE PREFERRED EMBODIMENTS

Figure 1:
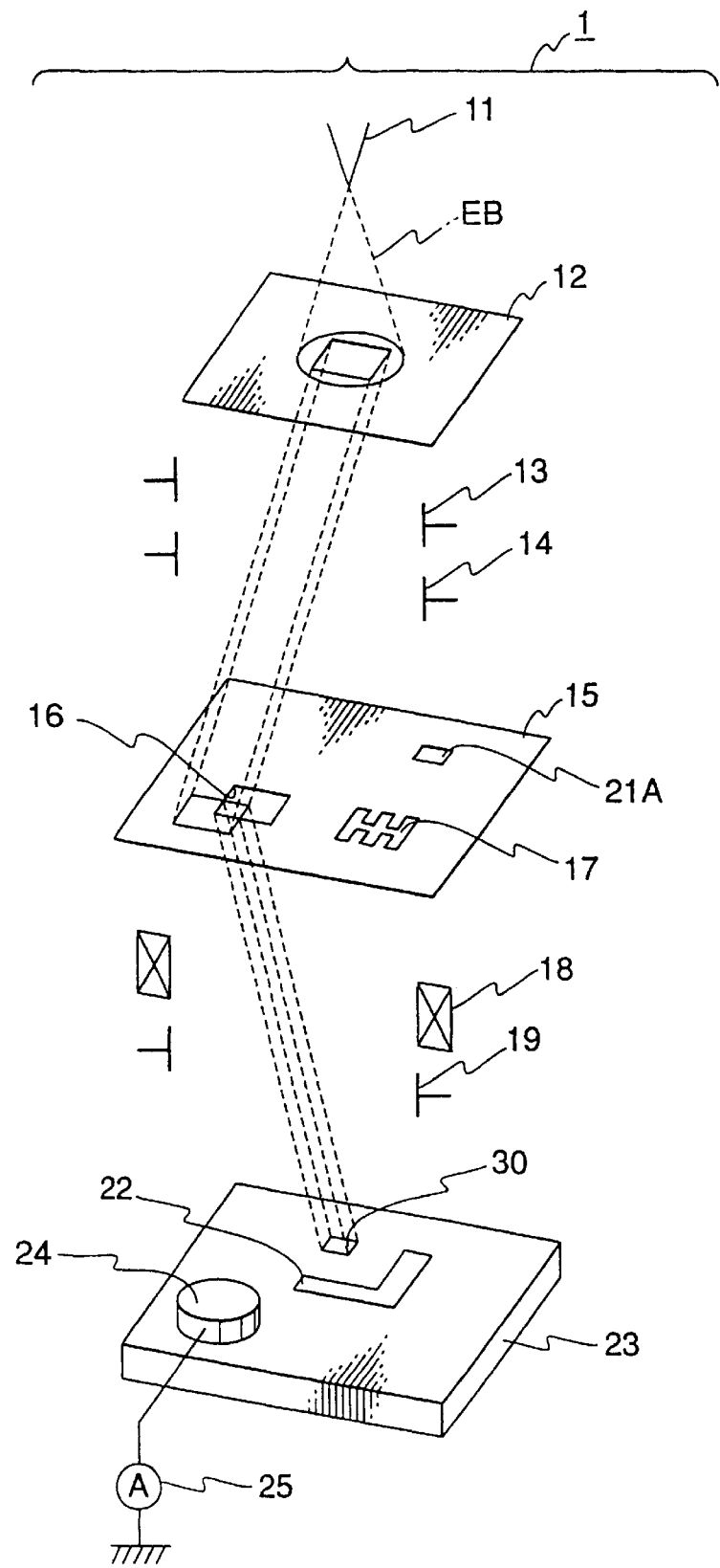
FIG. 1 is a schematic depicting an electron-beam exposure apparatus to illustrate a first embodiment of the present invention.

The first embodiment of the present invention is described with reference to FIGS. 1 and 2. FIG. 1 is a schematic of an electron-beam direct exposure apparatus 1 designed to illustrate the first embodiment, and FIG. 2 is a plan view depicting, in enlarged form, the second aperture 15 used in the first embodiment. The beam spot described below is designated by the symbol 30 in the drawings.

The electron-beam direct exposure apparatus 1 of the present embodiment comprises an electron gun 11 for emitting an electron beam EB, and a first aperture 12 for transforming the cross section of the electron beam EB emitted by the electron gun 11 to a quadrilateral shape. FIG. 1 shows the electron gun 11 in proximity to the first aperture 12, but, in actual fact, the gun is disposed at a distance that allows a parallel electron beam to be produced by the first aperture.

The electron-beam direct exposure apparatus 1 also comprises a second aperture 15 provided with a variable-shape opening 16 and partial one-shot exposure openings 17, and a variable-shape deflector 13 whereby the electron beam EB whose shape has been changed to a square by the first aperture 12 is deflected and projected onto the variable-shape opening 16 in the second aperture 15. This variable-shape deflector 13 is designed to produce any beam spot dimension on the wafer (not shown in FIG. 1), depending on the positional relationship between the electron beam EB and the variable-shape opening 16. The electron-beam direct exposure apparatus 1 further comprises a selecting deflector 14 for directing the electron beam EB produced by the first aperture 12 toward an arbitrary partial one-shot exposure opening 17 in the second aperture 15 during partial one-shot exposure.

The functional difference between the variable-shape deflector 13 and the selecting deflector 14 will now be described. The selecting deflector 14 is designed to produce a substantial deflection action so that the electron beam EB passing through the first aperture 12 can reach a partial one-shot exposure opening 17. The variable-shape deflector 13, on the other hand, is designed to finely adjust the dimensions of the beam spot produced by the variable-shape opening 16. Thus, the variable-shape deflector 13 performs deflection with higher accuracy than does the selecting deflector 14. Specifically, the variable-shape deflector can adjust the size of the beam spot to an accuracy of about 0.01 micrometer.

The electron-beam direct exposure apparatus 1 also comprises a reduction lens 18 for reducing the electron beam EB passing through the second aperture 15, and a deflector 19 for directing the reduced electron beam EB toward any point on the wafer (not shown). The role of the reduction lens is to focus the electron beam on a stage 23. The reduction lens used in the present embodiment reduces the electron beam passing through the second aperture 15 to $1/25$ of its original size.

In the present embodiment, the second aperture 15 is provided with a beam spot dimension correction opening 21A in addition to the partial one-shot exposure openings 17 obtained by the partial removal of exposure patterns. The beam spot dimension correction opening 21A has a square surface shape that measures 25 micrometers both longitudinally and transversely. The first step for correcting the dimensions of a beam spot with the aid of the electron-beam exposure apparatus described above involves correcting the beam spot dimensions of the electron beam EB obtained using the variable-shape opening 16.

Specifically, the electron beam EB emitted by the electron gun 11 is shaped by the first aperture 12 into a square measuring 130 micrometers on a side. The electron beam is then deflected by the variable-shape deflector 13 and directed toward the variable-shape opening 16 formed in the second aperture 15. The variable-shape opening 16 is shaped as a square measuring 125 micrometers on a side.

At the same time as it is reduced by the reduction lens 18, the electron beam EB passing through the variable-shape opening 16 is directed by the deflector 19 toward a reference mark 22 on the stage 23. The electron beam passing through the variable-shape opening 16 is reduced by the reduction lens 18 to $1/25$ of its original size. At this time, the deflector 19 forms a beam spot on the reference mark 22 of the stage 23 under the original design conditions. Beam spot dimensions can be obtained by monitoring electron beam signals reflected from the reference mark 22.

A specific method for monitoring beam spot dimensions will now be described. First, a beam spot is formed on the stage 23 under conditions that allow prescribed beam spot dimensions (for example, a square shape measuring 2 micrometers on a side) to be obtained. The edges of the reference mark 22 (consisting of gold, tungsten, or another heavy metal) on the stage 23 are then scanned crosswise. The reflected electron signal obtained at this time is registered by a sensor and linearly differentiated. The threshold is set at 50% of the maximum detected value of the reflected electron signal obtained during scanning, and a trigger signal is generated. Because the timing of the trigger signal varies with the dimensions of the beam spot, the actual beam size can be calculated by measuring the width of the trigger signal.

These operations are performed for a plurality of beam spot dimensions (for example, 1 micrometer, 2 micrometers, 3 micrometers, etc.) by varying the deflection of the variable-shape deflector 13. For example, an electron beam is projected under conditions that produce a square beam spot measuring 1 micrometer on a side. At this time, the actual beam spot dimensions are also determined based on the aforementioned reflection electron signal. The error is calculated for the two results. Finally, the deflection of the variable-shape deflector 13 is adjusted to allow this error to be corrected. Specifically, the beam spot dimensions are varied in 1-micrometer steps from 1 micrometers to 5 micrometers (both longitudinally and transversely), and correction is performed for each of the beam spot dimensions obtained using the variable-shape opening 16.

For a plurality of beam spots produced by the variable-shape opening 16, the electron current density of the beam spot projected onto the stage 23 is measured by the method described below before or after each dimension is corrected. The reason is that this method can be used for correcting the dimensions of a beam spot produced by partial one-shot exposure, as described below. The electron gun 11 used in the present embodiment has an electron current density of 100 amperes per square centimeter. The electron beam EB emitted by the electron gun 11 is highly stable under normal conditions. In addition, an offset value is kept unchanged through a series of exposure steps if the beam reduction ratio provided by the reduction lens 18 is neither varied in any significant measure nor offset in relation to the design value. Consequently, the value of the electron current density of the beam spot measured in this case is kept constant throughout a series of exposure steps, including a step for correcting the dimensions of this beam spot.

A second step for correcting the dimensions of the beam spot involves measuring the entire current of the beam spot transmitted by the beam spot dimension correction opening 21A and formed on the stage 23.

Specifically, an electron beam EB shaped by the first aperture 12 as a square measuring 130 micrometers on a side is deflected by the selecting deflector 14 and directed toward the beam spot dimension correction opening 21A.

The electron beam passing through this beam spot dimension correction opening 21A is directed by the deflector 19 toward a Faraday cup collector 24, and the beam spot current is measured by an ammeter 25. Actual measurement results obtained under prescribed conditions will now be described.

In this case, the electron current density of the electron beam was calculated in advance and found to be 10 amperes per square centimeter, as described above. When the beam spot dimension correction opening 21A shows good agreement with the design value and has a square shape measuring 25 micrometers on a side, the dimensions of the beam spot on the stage 23 under the design conditions of the present embodiment are expected to corresponded to a square measuring 1 micrometer on a side, and the corresponding current is expected to be 100.000 nanoamperes. However, the total current of the beam spot measured under certain conditions was 108.106 nanoamperes.

Based on the above results, the dimensions of an actual beam spot produced by the beam spot dimension correction opening 21A were calculated and found to correspond to a square measuring 1.04 micrometers both longitudinally and transversely. The reason is that the surface area of a 1.04-micrometer square is 1.0816 square micrometers, and dividing the total measured current of 108.160 nanoamperes by the value of this surface area produces an electron current density of 10 amperes per square centimeter, which is in agreement with the electron current density measured in advance. In other words, both the longitudinal and transverse dimensions of a beam spot on the stage 23 exceed the design value of 1 micrometer by 0.04 micrometer.

It can be seen that because the reduction lens 18 of the present embodiment is designed to reduce the electron beam to one twenty-fifth of its original size, the beam spot dimension correction opening 21A in the second aperture 15 has a shape that exceeds the design dimensions by about 1 micrometer both longitudinally and transversely as a result of the fact that 0.04 is multiplied by 25. It is believed that this 1-micrometer error is created by the manufacturing processes performed during the fabrication of the second aperture.

Figure 5A:
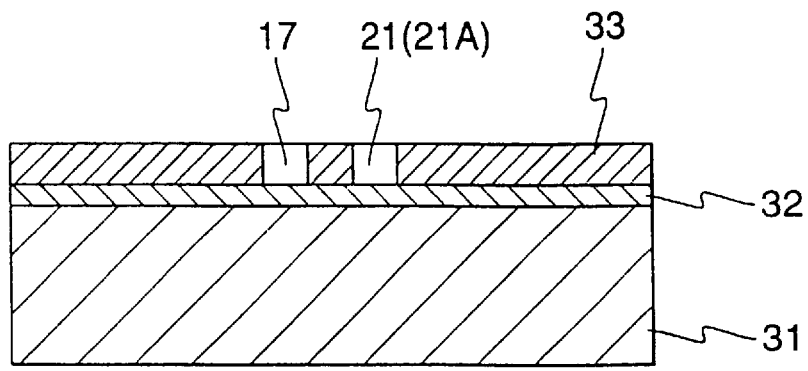
FIG. 5 is a cross section depicting a manufacturing example of a partial one-shot exposure opening and an opening for correcting the dimensions of a beam spot.
Figure 5B:
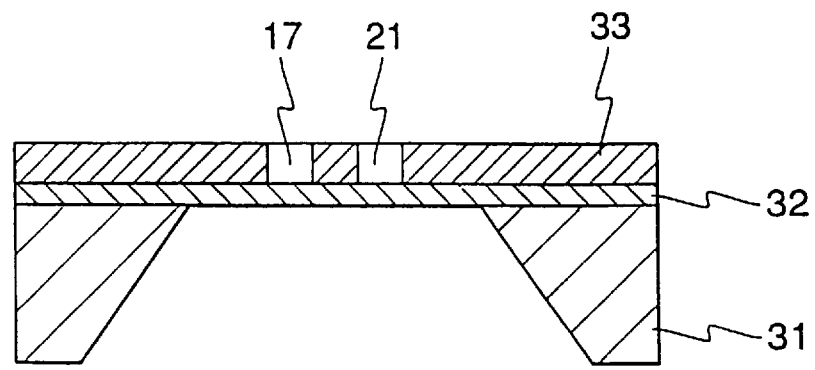
Figure 5C:
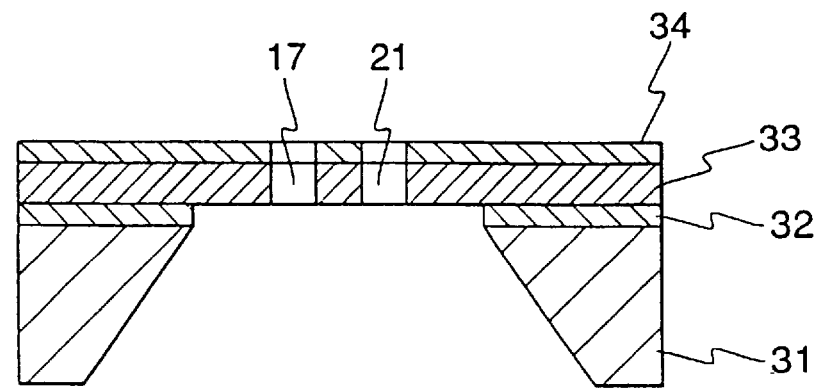
Figure 6:
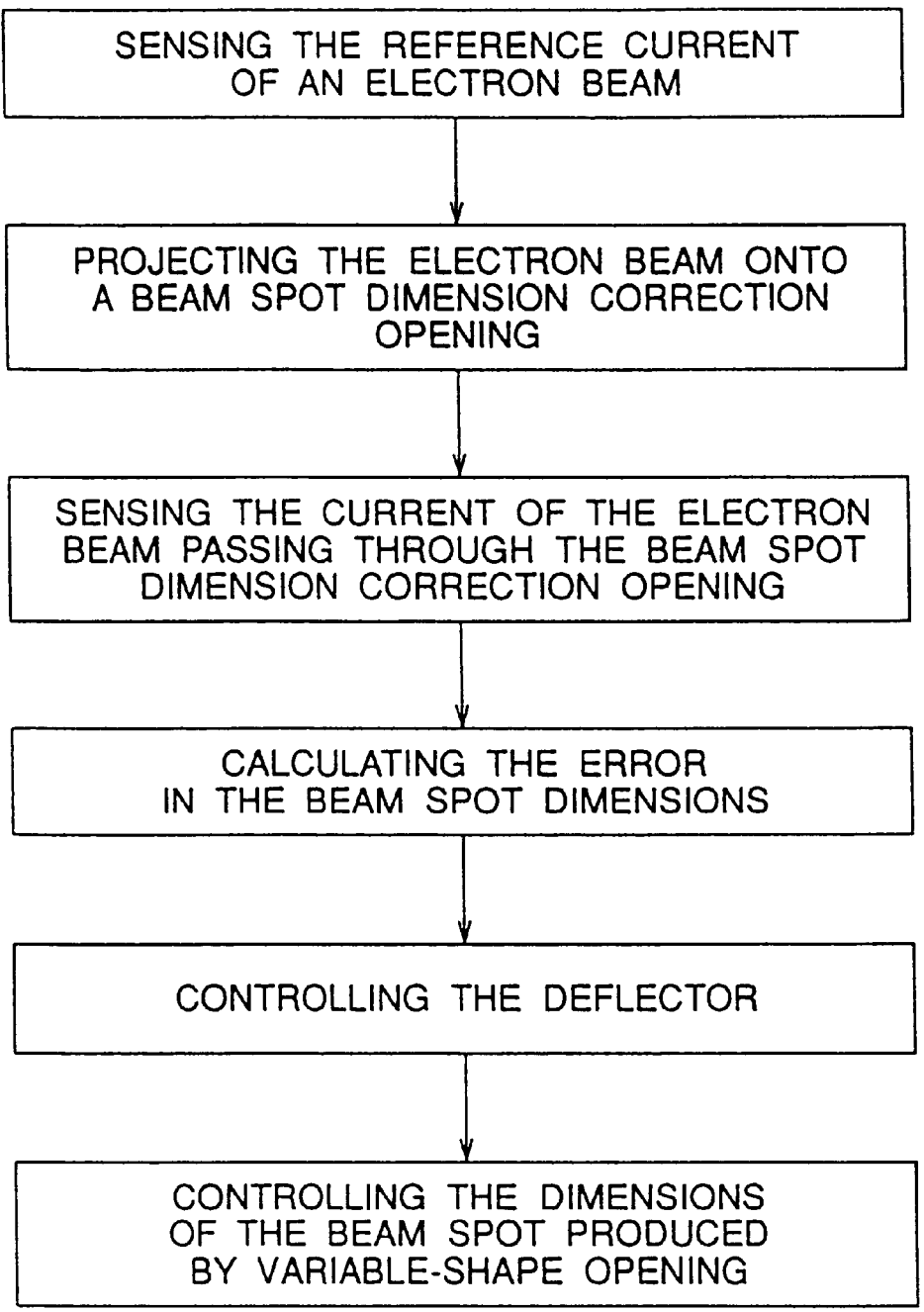
FIG. 6 is a flow chart of method of present invention.
Figure 7:
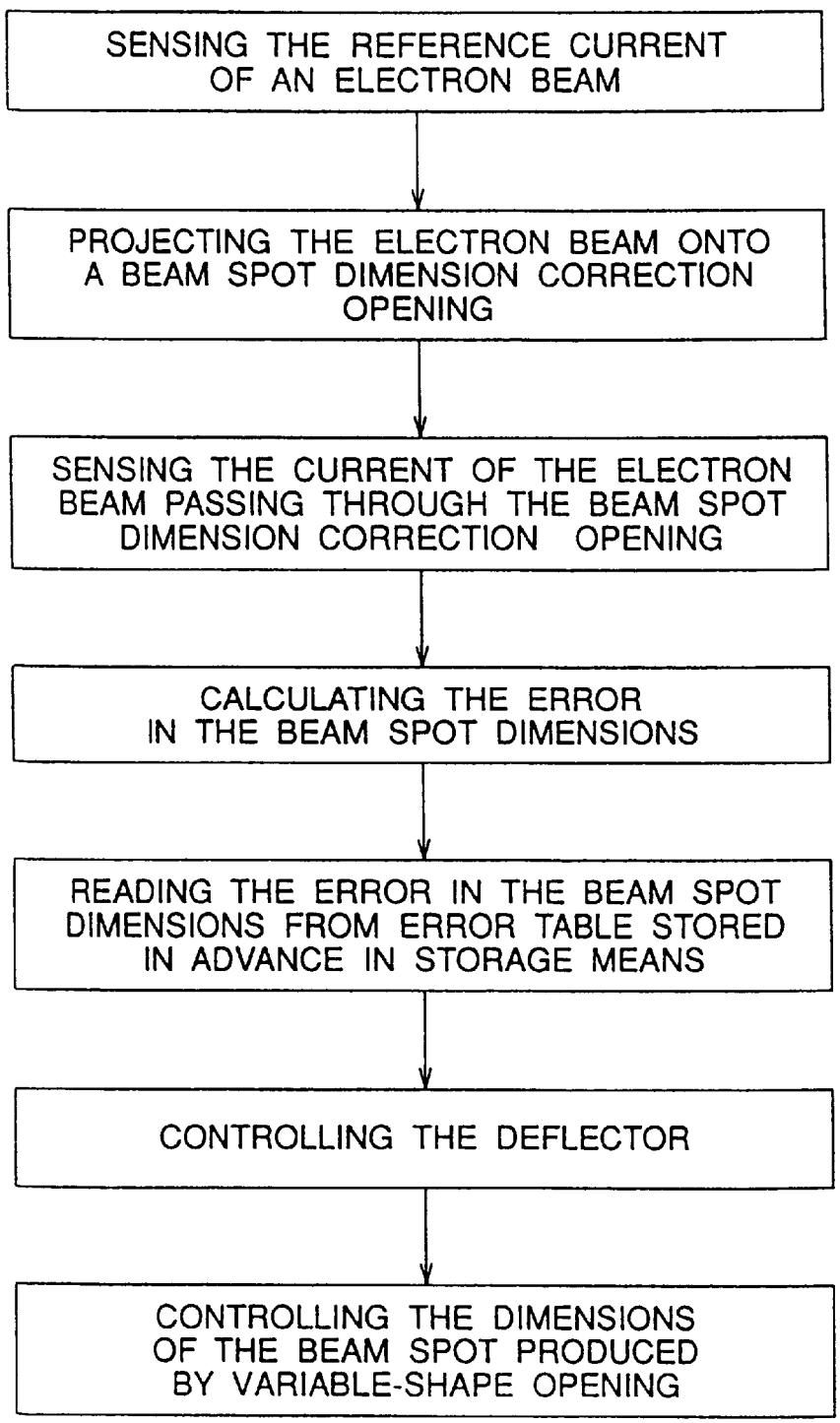
FIG. 7 is a flow chart of another method of present invention.
Figure 8:
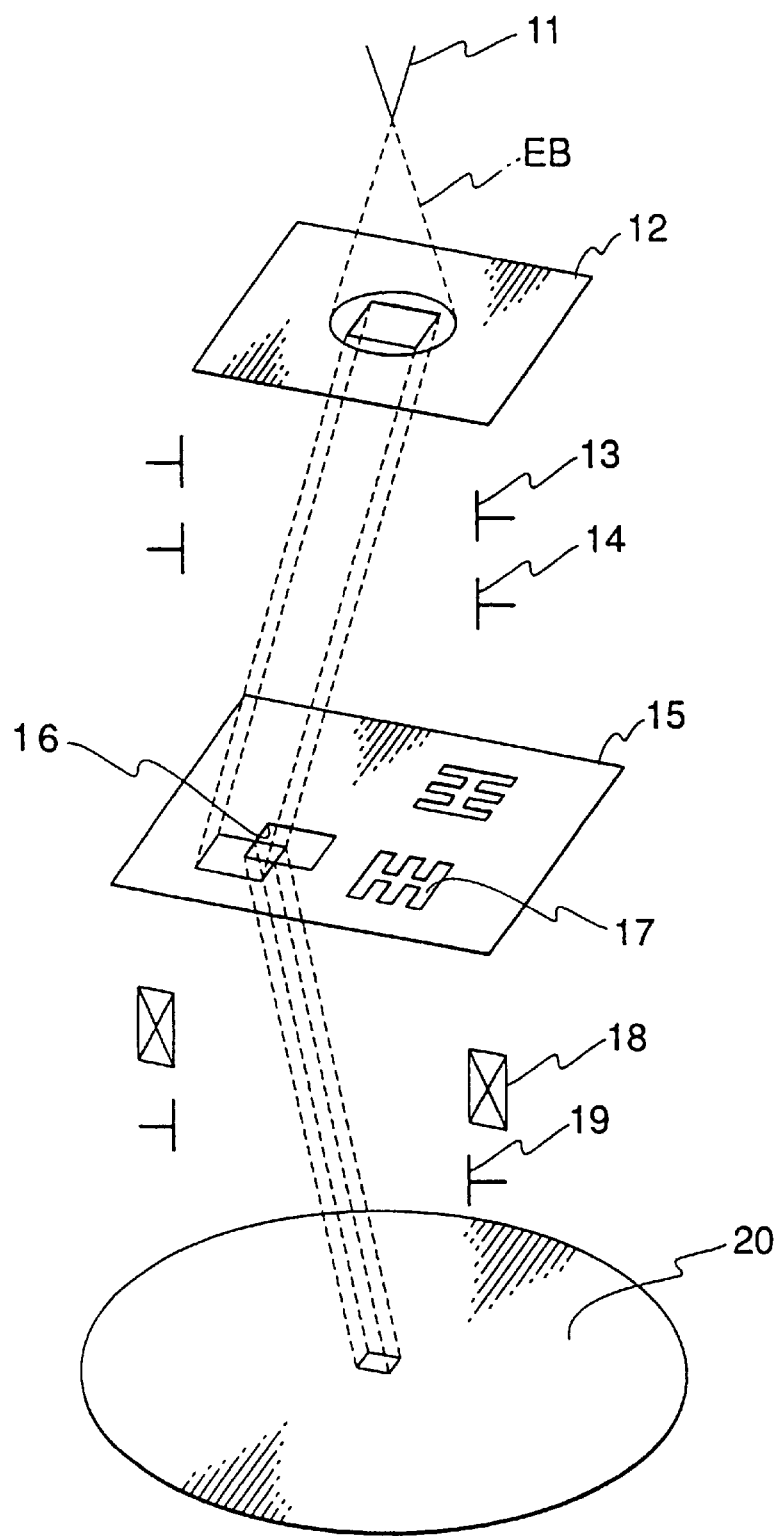
FIG. 8 is a schematic depicting an electron-beam exposure apparatus pertaining to a conventional example.
Figure 9:
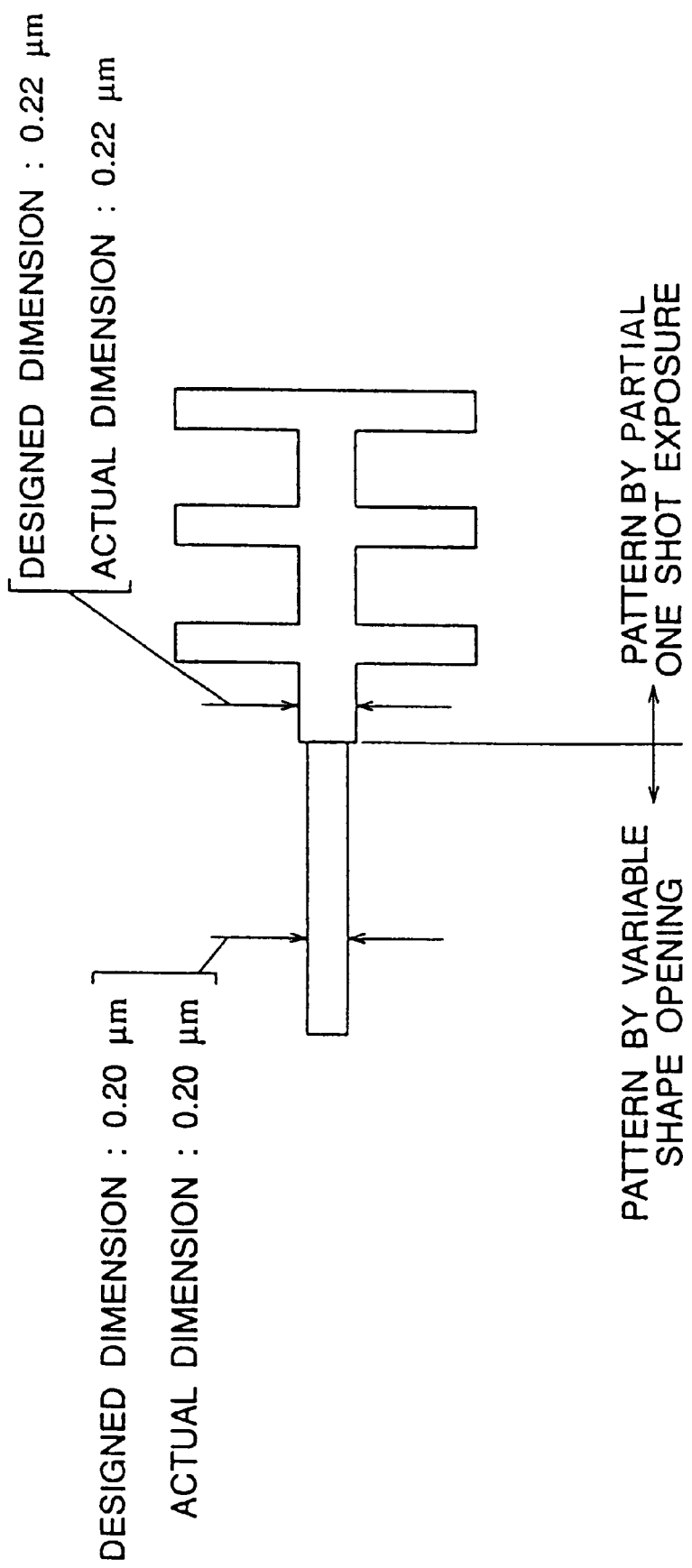
FIG. 9 is a plan view depicting a pattern exposed using the electron-beam exposure apparatus shown in FIG. 8.

The step for manufacturing the beam spot dimension correction opening 21A will now be described. Partial one-shot exposure openings 17 are formed during the same step as the beam spot dimension correction opening 21A. Specifically, the surface of a silicon substrate 31 is covered with a silicon oxide film 32, as shown in FIG. 5. A silicon film 33 with a film thickness of 10 to 20 micrometers is further formed on the silicon oxide film 32. A partial one-shot exposure opening 17 and a beam spot dimension correction opening 21A are then simultaneously formed in the silicon film 33 by a photolithographic step that includes an etching step (see FIG. 5A).

The areas of the silicon substrate 31 that correspond to the partial one-shot exposure opening 17 and the beam spot dimension correction opening 21A are subsequently removed from the back surface (see FIG. 5B), and the exposed silicon oxide film 32 thus exposed is removed, exposing the back surface of the silicon film 33. A metal film 34 is then formed on the surface of the silicon film 33 (see FIG. 5C).

Because the partial one-shot exposure opening 17 and the beam spot dimension correction opening 21A are simultaneously formed by photolithography in such a manner, the error in the design dimensions of the beam spot dimension correction opening 21A is equal to the error in the design dimensions of the partial one-shot exposure opening 17.

In the case described above, the beam spot dimension correction opening 21A contained a dimensional error. However, the beam spot dimension correction opening 21A and the partial one-shot exposure opening 17 develop errors in the same manner when an error is created by fluctuations in the beam reduction ratio or the like of the reduction lens 18. The same applies to dimensional errors resulting from the aforementioned manufacturing steps and to errors resulting from the superposition of fluctuations in the beam reduction ratio.

A third step for correcting the dimensions of a beam spot involves correcting the dimensions of a beam spot produced by the variable-shape opening 16. This is done to make the dimensions of the beam spot produced by the variable-shape opening 16 consistent with the dimensions of the beam spot produced by the partial one-shot exposure opening 17 on the stage 23. Specifically, this correction step involves increasing the dimensions of the beam spot produced by the variable-shape opening 16 by 0.04 micrometer both longitudinally and transversely. This 0.04 micrometer is the error calculated based on the electron beam current, as described above.

The relation between the correction for the variable-shape deflector 13 and the variation in the dimensions of the beam spot produced by the variable-shape opening 16 is expressed by a linear equation both longitudinally and transversely, as shown by Equations 1 and 2 below.

$$dW = a0 + (a1 \times W) + (a2 \times H) + (a3 \times W \times H) \quad \text{Equation 1}$$

$$dH = b0 + (b1 \times H) + (b2 \times W) + (b3 \times H \times W) \quad \text{Equation 2}$$

Here, W is the width of the beam spot on the stage 23 along the x axis, and H is the height along the y axis, dW and dH designate the corrections along the x axis and y axis for a beam spot whose beam spot dimensions are W and H, respectively.

Furthermore, a0 and b0 are the values of shift terms. A shift term, which is an error unrelated to the dimensions of a beam spot, describes cases in which the same shift is corrected, be it a 1-micrometer square beam spot or a 2-micrometer square beam spot. Moreover, a1 and b1 are coefficients of gain terms (W-dependence terms), while a2 and b2 are coefficients of rotational terms (H-dependence terms). As used herein, "gain term" and "rotational term" refer to errors generated at a constant rate with respect to the dimensions of a beam spot.

Finally, a3 and b3 are trapezoidal terms (W- and H-dependent terms).

The aforementioned error of 0.04 micrometer is added to the coefficients a0 and b0 of the shift terms, which are the first terms unrelated to the beam spot dimensions in the aforementioned equations 1 and 2 for the dimensional correction of beam spots.

As a result, the spot beams formed on the stage 23 by the partial one-shot exposure opening 17 and the variable-shape opening 16 have the same dimensions. An effective accuracy-improving technique is to implement precise correction by making use of fourth terms (trapezoidal terms) together with second terms (gain terms) or third terms (rotational terms) in which beam spot dimensions serve as parameters.

A dimensional difference of 0.04 micrometer has existed between the pattern obtained by exposure through the partial one-shot exposure openings 17 and the pattern obtained by exposure through the variable-shape opening 16, but the method of the present invention eliminates the dimensional difference between the two patterns.

A plurality of locations were measured to determine the dimensions of patterns believed to have the same design dimensions and obtained using the variable-shape opening 16 and the partial one-shot exposure openings 17. Dimensional differences of patterns obtained by exposure through the variable-shape opening 16 and the partial one-shot exposure openings 17 were statistically processed and found to be 0.07 micrometer (three sigma limited). On the other hand, since the correction of the present embodiment involved suppressing the difference in dimensions between beam spots, the dimensional accuracy (three sigma limited) was improved to 0.03 micrometer.

The aforementioned equations 1 and 2 will now be described in further detail. Since a variable-shape beam has a quadrilateral shape, the dimensions of the beam spot are represented by the width W along the x axis and the height H along the y axis in a surface shape. Let the dW and dH values calculated based on equations 1 and 2 above be the correction values. These correction values dW and dH are fed back to the deflection value of the variable-shape deflector 13 for the variable-shape opening 16.

Let us, for example, consider the dimensional correction value dW for the W value of a beam in which W=214 m, H=114 m, and the correctional coefficients of equation 1 are as follows: a0=+0.01 (shift term), a1=+0.002 (gain term; W-dependent term), a2=+0.001 (rotational term; H-dependent term), and a3=+0.003 (trapezoidal term; W- and H-dependent term). Substituting each of the values into equation 1 yields dw=(+0.01)+(+0.002×2)+(+0.001×1)+(+0.0003×2×1)=0.0156 micrometer. The variable-shape deflector 13 is controlled in such a way that this value (0.0156 micrometer) can be corrected.

Figure 3:
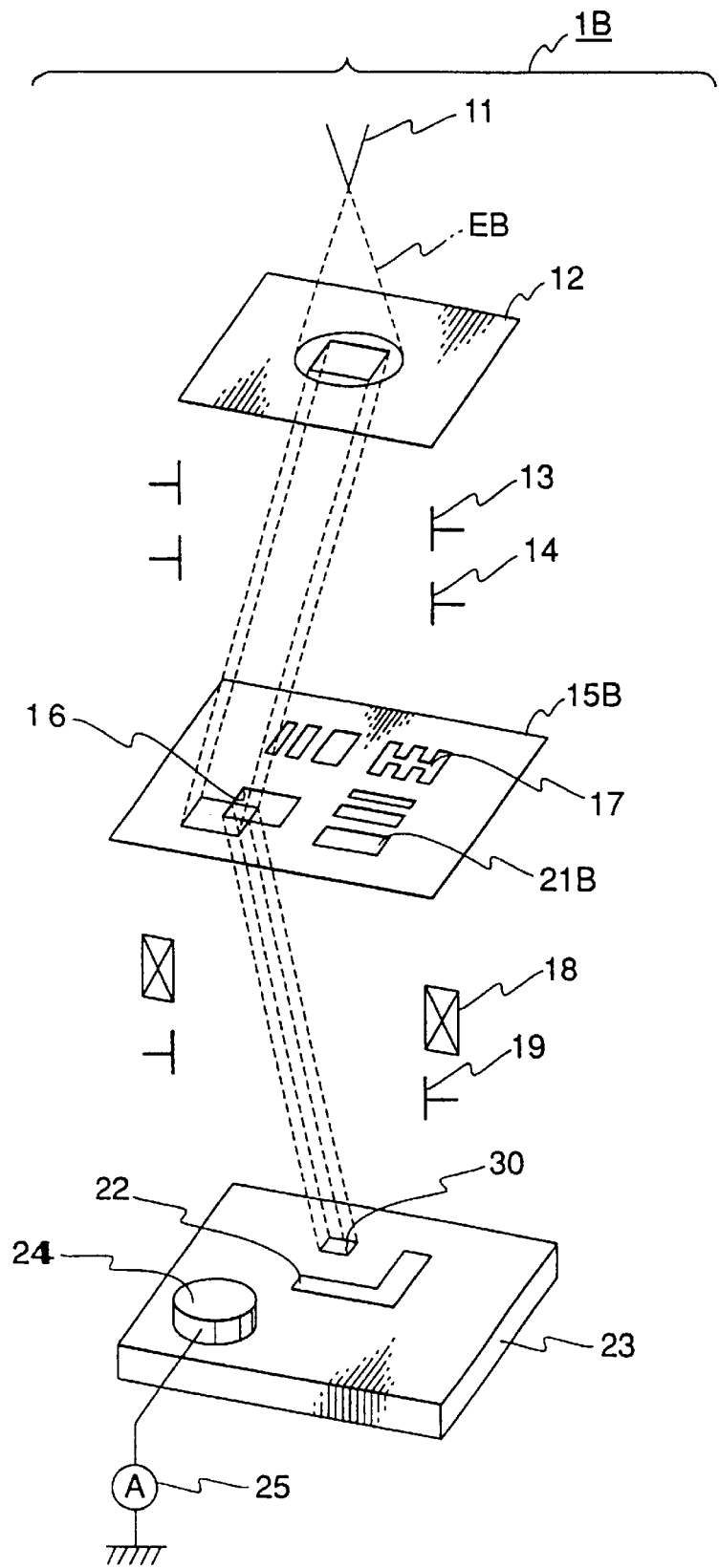
FIG. 3 is a schematic depicting an electron-beam exposure apparatus to illustrate a second embodiment of the present invention.

A second embodiment of the present invention will now be described with reference to FIGS. 3 and 4. FIG. 3 is a schematic of an electron-beam direct exposure apparatus 1B designed to illustrate a second embodiment, and FIG. 4 is a plan view depicting, in enlarged form, a second aperture 15B used in the second embodiment.

Figure 4:
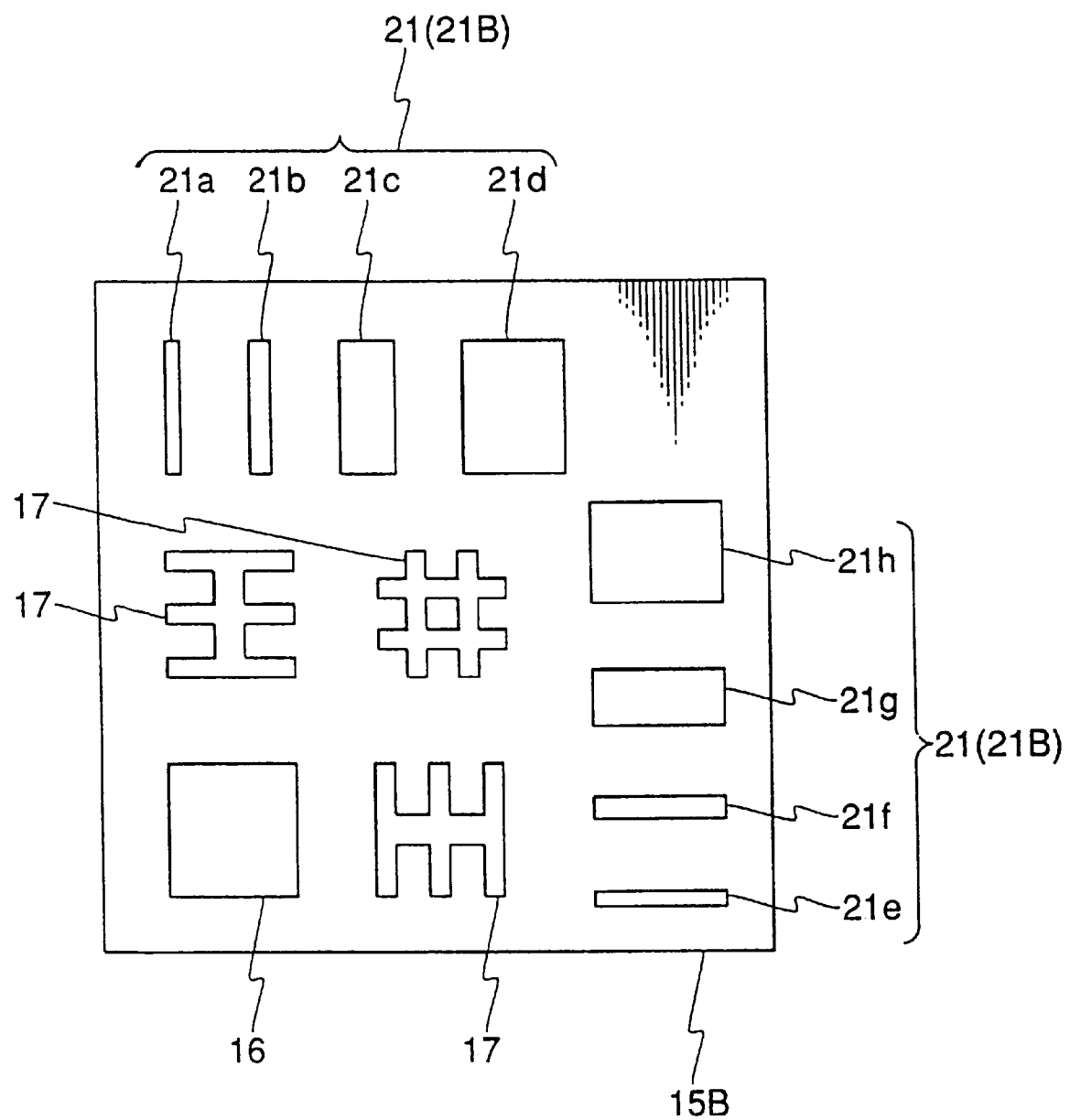
FIG. 4 a plan view depicting the second aperture shown in FIG. 1.

In FIGS. 3 and 4, the same symbols are assigned to the elements identical to those depicted in FIGS. 1 and 2, so duplicate descriptions are omitted.

The second aperture 15B is provided with a plurality of beam spot dimension correction openings 21 through 21h (a total of eight openings) for forming an electron beam EB. These are obtained by the partial removal of exposure patterns and are provided separately from the partial one-shot exposure openings 17.

The beam spot dimension correction openings 21a, 21b, 21c, 21d, 21e, 21f, 21g, and 21h thus formed are divided into the beam spot dimension correction openings 21a, 21b, 21c and 21d whose longitudinal dimension is set to a constant value of 125 micrometers, and the beam spot dimension correction openings 21e, 21f, 21g, and 21h whose transverse dimension is set to the constant value of 125 micrometers.

The transverse dimensions of the beam spot dimension correction openings 21a, 21b, 21c, and 21d are 12.5 s (symbol 21a in FIG. 4), 25 micrometers (symbol 21b in FIG. 4), 50 micrometers (symbol 21c in FIG. 4), and 100 micrometers (symbol 21d in FIG. 4), respectively.

Meanwhile, the transverse dimensions of the beam spot dimension correction openings 21e, 21f, 21g, and 21h are 12.5 s (symbol 21e in FIG. 4), 25 micrometers (symbol 21f in FIG. 4), 50 micrometers (symbol 21g in FIG. 4), and 100 micrometers (symbol 21h in FIG. 4), respectively. These openings have a constant transverse dimension (the dimension in the transverse direction in FIG. 4) of 125 micrometers. Specifically, a total of eight beam spot dimension correction openings 21a, 21b, 21c, 21d, 21e, 21f, 21g, and 21h are provided.

In this case, an electron beam passing through the second aperture 15B is reduced to ⅕s and projected onto a stage 23. For this reason, the theoretical dimensions of a beam spot on the stage 23 in the longitudinal and transverse directions should be, respectively, 5×0.5 micrometer, 5×1 micrometer, 5×2 micrometers, and 5×4 micrometers; and 0.5×5 micrometers, 1×5 micrometer, 2×5 micrometer, and 4×5 micrometers.

In the present embodiment, the dimensions of beam spots are first corrected in the same manner as in the first embodiment described above. This is done during the step for correcting the dimensions of beam spots.

Second, the step for correcting the dimensions of beam spots subsequently entails measuring the currents created by the electron beams passing through the small beam spot dimension correction openings 21a, 21b, 21c, 21d, 21e, 21f, 21g, and 21h. The measurement values of the currents created by the electron beam passing through the beam spot dimension correction openings 21a, 21b, 21c, 21d, 21e, 21f, 21g, and 21h are 225.625 nanoamperes (for 21a and 21e in FIG. 4), 451.250 nanoamperes (for 21b and 21f in FIG. 4), 901.500 nanoamperes (for 21c and 21g in FIG. 4), and 1805.000 nanoamperes (for 21d and 21h in FIG. 4), respectively. At this time, it is found in advance that the electron current density of an electron beam is 10 amperes per square centimeter.

This indicates that each of the beam spot dimension correction openings 21B in the second aperture 15B is formed to dimensions that are 5% less than the longitudinal or transverse design dimensions. For example, the beam spot dimension correction opening 21a should have a longitudinal or transverse length of 5×0.5 micrometer, but the 5-percent reduction brings the longitudinal dimension down to 4.75 micrometers and the transverse dimension down to 0.475 micrometer. A calculation of the corresponding surface area yields 2.25625 square micrometers. Dividing the measured total current of 225.625 nanoamperes by this surface area yields an electron current density of 10 amperes per square centimeter. As a result, it is possible to use a back calculation method to determine that the dimensions of a beam spot are reduced by 5 percent both longitudinally and transversely.

Third, the step for correcting the dimensions of beam spots involves correcting the dimensions of the beam spots formed on the stage 23 following passage through the beam spot dimension correction openings 21a, 21b, 21c, 21d, 21e, 21f, 21g, and 21h. Specifically, because the dimensions of the beam spots produced by the partial one-shot exposure openings 17 are reduced by 5 percent both longitudinally and transversely, a variable-shape deflector 13 is controlled to achieve agreement with these dimensions, correcting down the dimensions of the beam spots produced by the variable-shape opening 16.

The relation between the beam spot produced by the variable-shape opening 16 and the correction action of the variable-shape deflector 13 is usually represented in the form of a linear equation both longitudinally and transversely, as shown by equations 1 and 2 above.

Specifically, a fraction corresponding to an error of −5% is added to the coefficients a1 and b1 of the gain terms in the aforementioned correction equations. Prior to correction, a dimensional difference of 5% exists between the pattern exposed through a partial one-shot exposure opening 17 and the pattern exposed through the variable-shape opening 16. The dimensional difference between the two patterns is eliminated by the use of the correctional method pertaining to the present invention. In practice, the dimensions of resulting patterns are investigated in a plurality of locations, and a statistical treatment is performed. According to this treatment, the dimensional accuracy of an exposure pattern can be improved from the conventional 0.08 micrometer (three sigma limited) to 0.03 micrometer (three sigma limited).

The first embodiment entailed determining a constant shift amount because only one beam spot dimension correction opening 21A was involved, whereas the second embodiment entailed forming a plurality of beam spot dimension correction openings 21B of mutually different dimensions. As a result, the second embodiment is advantageous in that, for a shift amount, the gain component (an error that increases in proportion to the dimensions of a beam spot) can be accurately controlled when this gain component is intermediate between the shift amount and the opening dimensions of a partial one-shot exposure opening 17. On the other hand, in the first embodiment above, the beam spot dimension correction opening 21A has a considerably smaller surface area, than openings 21B making it possible to form a large number of partial one-shot exposure openings 17 in the second aperture 15. Another advantage is that correction can be completed in a short time. Embodiments of the present invention have been described above, but the present invention is not limited by these embodiments. The number, size, and arrangement of the beam spot dimension correction openings described with reference to the embodiments can be combined in a variety of ways. For example, it is possible for the beam spot dimension correction openings not to exceed the maximum beam spot dimensions defined by the dimensions of the variable-shape exposure opening in the first aperture 12, and for settings to be selected freely as long as the electron beam can be projected by the selecting deflector 14 onto any location.

Another feature of the above-described embodiments is that the dimensional error of a beam spot is taken to be a constant shift or gain value in the correction of beam spot dimensions produced by the variable-shape opening 16. However, these embodiments allow the coefficients of trapezoidal terms or higher-order terms (quadratic or the like) to be calculated, and dimensional errors to be corrected by measuring the dimensional differences in further detail.

Yet another feature of the present embodiments is that the adopted method entails measuring the dimensions of a beam spot produced by a variable-shape opening, and correcting dimensional errors as coefficients of a correctional formula. However, the present embodiments are not limited to this option and allow dimensional errors to be stored as tables containing, as parameters, the longitudinal and transverse dimensions of beam spots, and the dimensions of the beam spots produced by variable-shape openings to be corrected. In other words, it is possible to adopt a method in which corrections for beam spot dimensions are expressed (stored) as tables rather than as correctional formulas and formula coefficients, as in the embodiments. When, for example, the dimensions of a beam spot correspond to a 1-micrometer square, the corresponding correction is taken to be 0.01 micrometer, and when the dimensions of a beam spot correspond to a 2-micrometer square, the corresponding correction is stored as 0.03 micrometer. Thus, an advantage is that the treatment rate can be increased by the advance storage of corrections as tables at prescribed memory locations.

As described above, the present invention involves measuring the current of an electron beam passing through beam spot dimension correction openings formed in advance in a second aperture during electron beam exposure based on a partial one-shot exposure principle, and adding the difference between the projected current and the design value as a difference in the dimensions of the beam spot to the beam spot dimensions of a variable-shape beam. This technique eliminates the difference in exposure pattern dimensions between partial one-shot exposure and variable-shape exposure, making it possible to improve the dimensional accuracy of a pattern produced by exposure.

The invention may be embodied in other specific forms without departing from the spirit or essential characteristic thereof. The present embodiments is therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 8-308479 (Filed on Nov. 19th, 1996) including specification, claims, drawings and summary are incorporated herein by reference in its entirety.

What is claimed is:

1. An electron-beam exposure apparatus, comprising:
   (a) an electron gun for emitting an electron beam;
   (b) a first aperture for converting the electron beam to a prescribed shape;
   (c) a second aperture provided with openings for varying the cross-sectional shape of the electron beam passing through the first aperture, wherein the second aperture comprises:
      (i) a variable-shape opening means for defining the shape of the electron beam;
      (ii) at least one partial one-shot exposure opening; and
      (iii) a beam spot dimension correction opening means for passing the electron beam to an electron beam sensor means;
   (d) the electron beam sensor means for correcting dimensions of the electron beam to be passed through the variable-shape opening means based on the electron beam passed through the beam spot dimension correction opening means; and
   (e) a first deflector for deflecting the electron beam passing through the first aperture, provided between the first aperture and the second aperture.

2. An apparatus according to claim 1, wherein the beam spot dimension correction openings are quadrilateral in shape.

3. An apparatus according to claim 2, further comprising a second deflector for deflecting the electron beam passing through the first aperture, provided between the first aperture and the second aperture.

4. An apparatus according to claim 3, wherein the first deflector comprises a selecting deflector for deflecting the electron beam to a considerable degree and wherein the second deflector comprises a variable-shape deflector for finely deflecting the electron beam.

5. An apparatus according to claim 3, wherein the dimensions of the electron beam to be passed through the variable-shape opening means are corrected by controlling a deflection value of the second deflector.

6. An apparatus according to claim 1, further comprising a stage for supporting a wafer, positioned downstream along the electron beam.

7. An apparatus according to claim 6, further comprising a current sensor for sensing the current developed by the electron beam on the stage surface.

8. An apparatus according to claim 6, further comprising a reference mark provided to the stage surface and conferred with considerable reflectivity in relation to the electron beam.

9. An apparatus according to claim 6, further comprising a reduction lens provided between the second aperture and the stage.

10. An apparatus according to claim 9, wherein the reduction ratio of the reduction lens is one twenty-fifth.

11. The apparatus according to claim 6, further comprising deflectors for deflecting the electron beam, provided between the second aperture and the stage.

12. An electron-beam exposure apparatus, comprising:
   (a) an electron gun for emitting an electron beam;
   (b) a first aperture for converting the electron beam to a prescribed shape;
   (c) a second aperture provided with openings for varying the cross-sectional shape of the electron beam passing through the first aperture, wherein the second aperture comprises:
      (i) a variable-shape opening;
      (ii) partial one-shot exposure openings; and
      (iii) beam spot dimension correction openings; and
   (d) deflectors for deflecting the electron beam passing through the first aperture, provided between the first aperture and the second aperture;

wherein the beam spot dimension correction openings are quadrilateral in shape and consist of a plurality of groups of openings in which a first length remains constant, and a length in an orthogonal direction to the first length varies.

13. The apparatus according to claim 12, wherein there are at least two deflectors.

14. An apparatus according to claim 13, further comprising a selecting deflector for deflecting the electron beam to a considerable degree and a variable-shape deflector for finely deflecting the electron beam.

15. The apparatus according to claim 12, further comprising a stage for supporting a wafer, positioned downstream along the electron beam.

16. The apparatus according to claim 15, further comprising a current sensor for sensing the current developed by the electron beam on the stage surface.

17. The apparatus according to claim 15, further comprising a reference mark provided to the stage surface and conferred with considerable reflectivity in relation to the electron beam.

18. The apparatus according to claim 15, further comprising a reduction lens provided between the second aperture and the stage.

19. The apparatus according to claim 18, wherein the reduction ratio of the reduction lens is one twenty-fifth.

20. The apparatus according to claim 15, further comprising deflectors for deflecting the electron beam, provided between the second aperture and the stage.

21. An electron-beam direct exposure method, comprising the steps of:
  sensing a reference current of an electron beam in which dimensions of a beam spot are accurately adjusted by a variable-shape opening in order to define the reference current;
  projecting the electron beam onto a beam spot dimension adjustment opening;
  sensing a current of the electron beam passing through the beam spot dimension correction opening;
  calculating an error in the beam spot dimensions on a basis of a difference between the reference current and the actual current; and
  controlling a deflector in such a way that the calculated error is corrected, and correcting the dimensions of the beam spot produced by the variable-shape opening.

22. An electron-beam direct exposure method, comprising the steps of:
  sensing a reference current of an electron beam in which dimensions of a beam spot are accurately adjusted by a variable-shape opening in order to define the reference current;
  projecting the electron beam onto a beam spot dimension adjustment opening;
  sensing a current of the electron beam passing through the beam spot dimension correction opening;
  reading an error in the beam spot dimensions that corresponds to a difference between the reference current and the actual current from an error table stored in advance in storage means; and
  controlling a deflector in such a way that the calculated error that has been read out is corrected, and correcting the dimensions of the beam spot produced by the variable-shape opening.

23. An electron beam shaping apparatus, comprising:
  an aperture provided with openings in the aperture body for varying a cross-sectional shape of an electron beam, the aperture comprising:
    (a) a variable-shape opening means for defining a shape of the electron beam;
    (b) a partial one-shot exposure opening; and
    (c) a beam spot dimension correction opening means for passing the electron beam to an electron beam sensor means; and
  the electron beam sensor means for correcting dimensions of the electron beam to be passed through the variable-shape opening means based on the electron beam passed through the beam spot dimension correction opening means.

24. An aperture provided with openings in the aperture body for varying a cross-sectional shape of an electron beam, comprising:
  (a) a variable-shape opening means for defining a shape of the electron beam;
  (b) a partial one-shot exposure opening; and
  (c) a beam spot dimension correction opening means for passing the electron beam to an electron beam sensor to correct dimensions of the electron beam to be passed through the variable-shape opening means;
    wherein the beam spot dimension correction opening means comprises a plurality of groups of quadrilateral shaped openings in which a first length remains constant, and a length in an orthogonal direction to the first length varies.

* * * * *